United States Patent [19]
Kim et al.

[11] Patent Number: 6,068,316
[45] Date of Patent: May 30, 2000

[54] LARGE DIAMETER WAFER CONVEYING SYSTEM AND METHOD THEREOF

[75] Inventors: Dae-Woo Kim, Suwon; Chang-Hyun Lim, Kunsan; Sang-Kook Choi; Jong-Dae Park, both of Suwon, all of Rep. of Korea

[73] Assignee: Samsung Electronics Co., Ltd., Suwon, Rep. of Korea

[21] Appl. No.: 08/768,696

[22] Filed: Dec. 18, 1996

[30] Foreign Application Priority Data

Dec. 30, 1995 [KR] Rep. of Korea ............. 95 68651

[51] Int. Cl.⁷ .................................................. B66C 1/02
[52] U.S. Cl. ...................................... 294/64.1; 294/87.1
[58] Field of Search ........................ 294/64.1, 64.3; 269/21; 414/941; 901/40

[56] References Cited

U.S. PATENT DOCUMENTS

| | | | |
|---|---|---|---|
| 2,999,715 | 9/1961 | Firestone | 294/64.1 |
| 3,865,420 | 2/1975 | Warren | 294/64.1 |
| 4,858,975 | 8/1989 | Ogawa | 294/64.1 |
| 5,217,273 | 6/1993 | Hendricsen et al. | 294/64.1 |

FOREIGN PATENT DOCUMENTS

| | | | |
|---|---|---|---|
| 2631502 | 1/1978 | Germany | 294/64.1 |
| 130536 | 6/1987 | Japan | 294/64.1 |
| 1198046 | 8/1989 | Japan | 294/64.1 |
| 547899 | 2/1993 | Japan | 294/64.1 |
| 5177556 | 7/1993 | Japan | 294/64.1 |

*Primary Examiner*—Johnny D. Cherry
*Attorney, Agent, or Firm*—Jones Volentine, L.L.P.

[57] ABSTRACT

A large diameter wafer conveying system includes a vacuum supplier and a valve unit for ON/OFF controlling a vacuum supplied from the vacuum supplier. A wafer holder stably absorbs and holds a wafer by using the vacuum supplied from the vacuum supplier through the valve unit. A residual vacuum clearer automatically clears a portion of the vacuum which remains after the valve unit is turned OFF to completely remove the vacuum.

13 Claims, 3 Drawing Sheets

LARGE DIAMETER WAFER CONVEYING SYSTEM AND METHOD THEREOF

BACKGROUND OF THE INVENTION

1. Field of the Invention

The present invention relates to a large diameter wafer conveying system, and more particularly, to a large diameter wafer conveying system in which the structure of a wafer holder for holding a wafer by vacuum absorption is modified in such a manner that the operation thereof can be stabilized, and which can prevent the wafer from being damaged by a residual vacuum when it is unloaded.

2. Description of the Related Art

Generally, in the semiconductor manufacturing process, extreme care should be taken when handling a wafer. For example, when the wafer is conveyed several times for sequential processes, including etching, diffusing, oxide layer growing, depositing, testing, and assembling, etc., the wafer is apt to be damaged due to inadvertent handling. The wafer may be damaged by scratches or by being broken into pieces, which critically affects yield.

Referring now to FIG. 1, a conventional wafer conveying system comprises a wafer holder 1 mounted on a conveying mechanism (not shown), a vacuum supplier 3 for supplying the wafer holder 1 with vacuum through a vacuum hose 2, and a valve unit 4 for switching the vacuum supplier 3 ON or OFF. As more clearly seen in FIGS. 2 and 3, the wafer holder 1 also includes several tweezers 1a for holding a wafer by vacuum absorption, and a tweezer block 1b for fixing the tweezers 1a.

Each tweezer 1a has a linear configuration, and the front end of each tweezer 1a is rounded to prevent the wafer from being damaged when it is loaded or unloaded. The tweezers 1a are vertically arranged, and the rear ends of the tweezers 1a are fixed to the tweezer block 1b, in order to convey several wafers simultaneously.

In the conventional wafer conveying system constructed as described above, when the valve unit 4 is turned ON to convey the wafer to a boat or a carrier, vacuum is supplied from the vacuum supplier 3 to the front end of the tweezer 1a, whereby the wafer is absorbed onto the tweezer 1a. If the valve unit 4 is turned OFF, the vacuum is removed to unload the wafer from the tweezer 1a.

However, the wafer conveying system constructed as mentioned above can only be applied to wafers having a diameter not greater than 8 inches. Accordingly, considering the trend toward larger diameter wafers, the conventional wafer conveying system has many drawbacks as discussed further below.

First, since the tweezer 1a of the wafer holder 1 absorbs and holds only one wafer, the larger the wafer, the larger must be the tweezer 1a to securely hold the wafer. If the wafer is not totally absorbed and held by the tweezer 1a at its center, there is a possibility that the horizontal balance of the wafer will be affected when conveying it, such that the wafer would be scratched or broken by the wall of a slot of the carrier, thereby lowering yield. Also, if the size of the tweezer 1a is not sufficiently large when the tweezer 1a holds a larger diameter wafer, for example, greater than 12 inches, the wafer will tend to sag and overlap the other wafer which has already been loaded in the carrier, thereby causing the wafer to be scratched, or generate contaminating articles, or even be broken.

Second, in the wafer conveying system which uses vacuum absorption for holding a wafer, even when the valve unit 4 is turned OFF to unload the wafer o n the boat or the carrier by removing the vacuum, there remains a residual vacuum in the wafer holder 1, causing the wafer to remain attached to a boat slot, resulting in a large amount of contaminating particles being transferred to other wafers disposed downwardly therefrom, deteriorating their quality.

SUMMARY OF THE INVENTION

Accordingly, in order to overcome one or more of the problems associated with the conventional art, it is an object of the present invention is to provide a large diameter wafer conveying system which can hold a wafer more stably, such that a tweezer of a wafer holder endures the load of the wafer in a sufficiently dispersed manner so as to prevent the wafer from being scratched, or generating contaminating particles, or being broken.

Another object of the present invention is to provide a large diameter wafer conveying system in which a residual vacuum clearer is provided to clear a residual vacuum which remains after a valve unit is turned OFF, thereby to prevent the wafer from remaining attached to a boat slot.

According to one aspect of the present invention, there is provided a large diameter wafer conveying system, comprising: vacuum supplying means; a valve unit for controlling a vacuum supplied from the vacuum supplying means by switching the vacuum supplying means ON or OFF; wafer holding means for stably absorbing and holding a wafer by using the vacuum supplied from the vacuum supplying means through the valve unit; and residual vacuum clearing means for automatically clearing a portion of the vacuum which remains after the valve unit is switched OFF to completely remove the vacuum.

According to another aspect of the present invention, the residual vacuum clearing means comprises a gas supplying means for supplying a gas to the wafer holding means to ensure the wafer holding means exists in an atmospheric pressure state when the valve unit is switched OFF, and a filtering member for filtering the gas supplied from the gas supplying means.

According to another aspect of the present invention, the gas supplied from said gas supplying means is either atmospheric air or $N_2$.

According to another aspect of the present invention, the valve unit is a three-way solenoid valve, which is designed such that when it is switched ON, the vacuum supplying means communicates with the wafer holding means, and when it is switched OFF, the residual vacuum clearing means communicates with the wafer holding means.

According to another aspect of the present invention, the wafer holding means comprises a plurality of tweezers forming a fork-shaped configuration which can simultaneously hold a plurality of wafers, and a tweezer block for fixing the plurality of tweezers, each of the plurality of tweezers being provided with a plurality of contacting portions which are spaced from each other by a certain horizontal distance.

According to another aspect of the present invention, each of the plurality of tweezers is provided with at least three contacting portions so as to hold the wafer while keeping it in balance.

According to another aspect of the present invention, the horizontal distance between adjacent contacting portions is in a range from 10 mm to 200 mm.

According to still another aspect of the present invention, each of the plurality of contacting portions is designed such that their free end is rounded off and vertically sloped, thereby preventing the wafer from being broken when each of the plurality of tweezers is struck by the wafer.

By the features of the present invention, it is possible to prevent a wafer from being scratched, or generating contaminating particles, or being broken. Also, the wafer can be stably held and then conveyed, thereby reducing defects and improving yield.

BRIEF DESCRIPTION OF THE DRAWINGS

The above objects, other features and advantages of the present invention will be more apparent after a reading of the following detailed description taken in conjunction with the drawings, in which.

DETAILED DESCRIPTION OF THE PREFERRED EMBODIMENT

A large diameter wafer conveying system in accordance with an embodiment of the present invention will be described in detail with reference to FIGS. 4 through 7.

Figure 1:
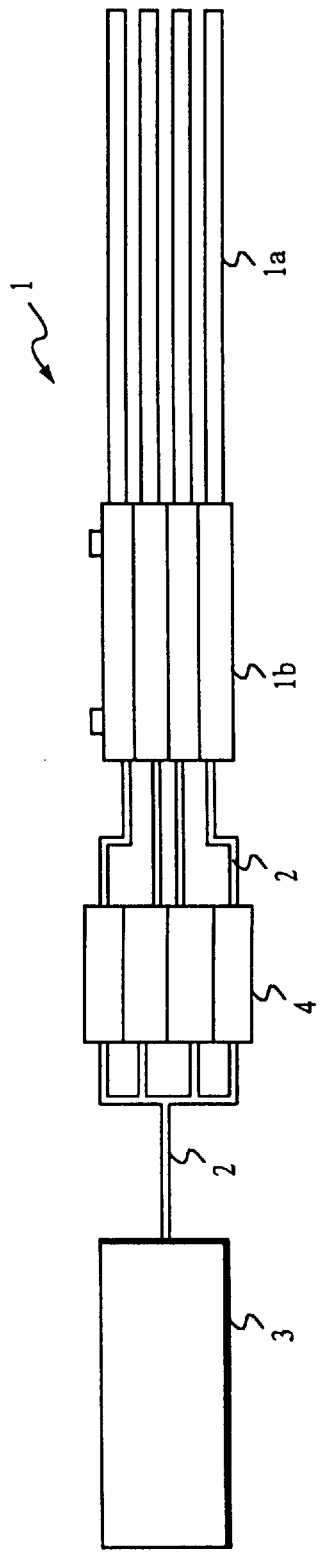
FIG. 1 is a schematic view illustrating a conventional wafer conveying system.
Figure 2:
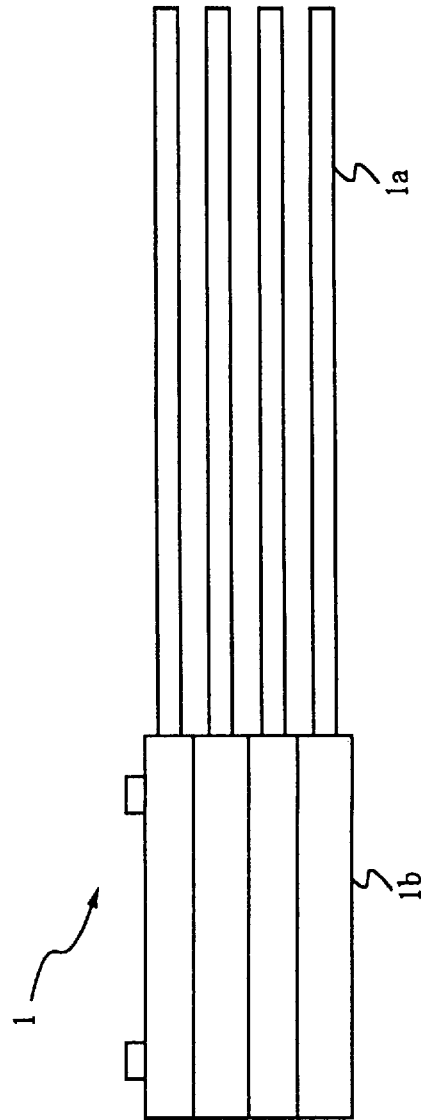
FIG. 2 is a front view illustrating a wafer holder of the convention wafer conveying system.
Figure 3:
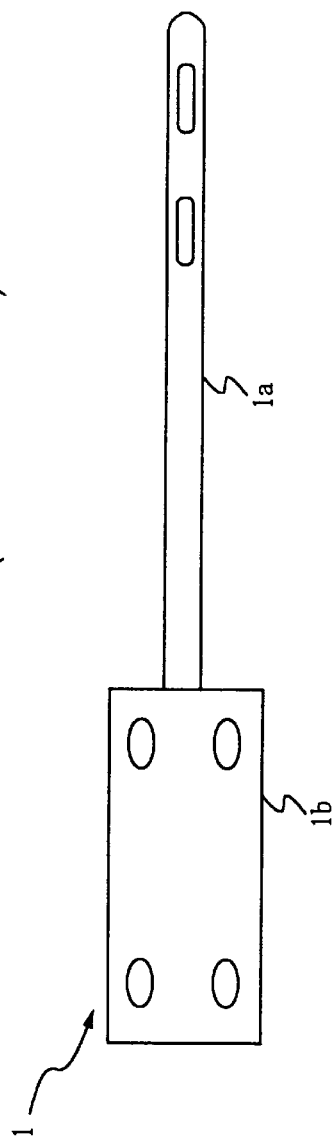
FIG. 3 is a plan view of the wafer holder FIG. 2.
Figure 4:
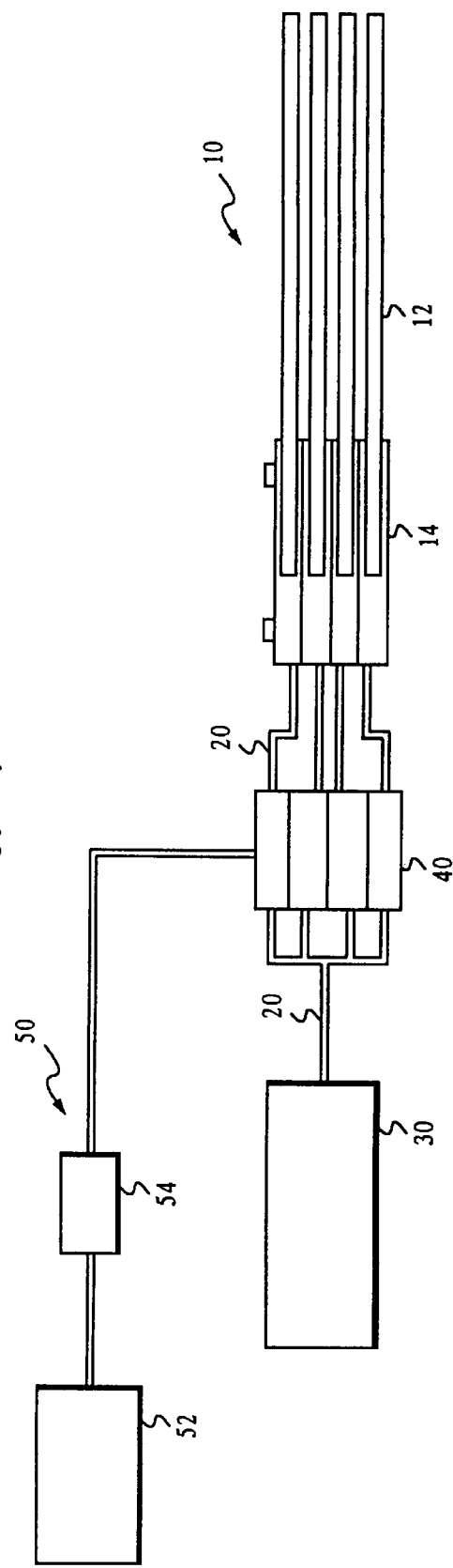
FIG. 4 is a schematic view illustrating a large diameter wafer conveying system in accordance with an embodiment of the present invention.
Figure 5:
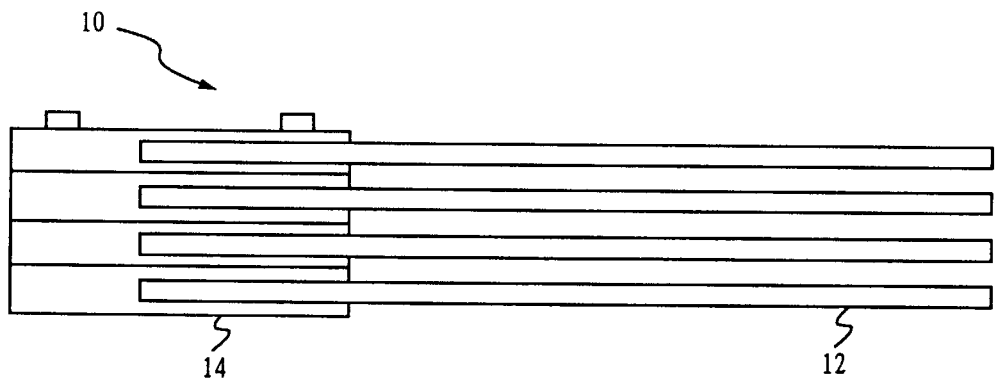
FIG. 5 is a front view illustrating a wafer holder of the large diameter wafer conveying system of FIG. 4.
Figure 6:
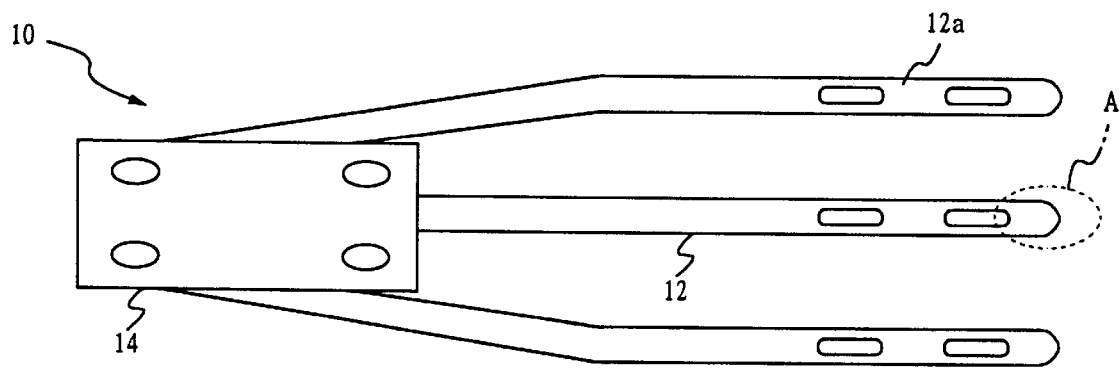
FIG. 6 is plan view of the wafer holder of FIG. 5.

Referring to FIG. 4, the wafer conveying system according to the present invention includes a wafer holder 10 which is mounted on a conveying mechanism (not shown). The wafer holder 10 communicates with a vacuum supplier 30 which supplies vacuum through a series of vacuum hoses 20. A valve unit 40 controls the vacuum which is supplied to the wafer holder 10 by switching the vacuum supplier 30 ON or OFF. The valve unit 40 is connected to the series of vacuum hoses 20.

A residual vacuum clearer 50 is connected to the valve unit 40 to clear a residual vacuum remaining in the wafer holder 10, even after the valve unit 40 is switched OFF, to completely remove the vacuum. The residual vacuum clearer 50 is designed to communicate with the wafer holder 10 when the valve unit 40 is switched OFF, so that the wafer holder 10 can be maintained at an atmospheric pressure state. For this purpose, the residual vacuum clearer 50 comprises a gas supplier 52 for supplying the wafer holder 10 with a gas such as atmospheric air or $N_2$, and a filtering member 54 for filtering the gas supplied from the gas supplier 52.

The valve unit 40 is a three-way solenoid valve which is designed such that when it is switched ON, the vacuum supplier 30 communicates with the wafer holder 10 so as to make the wafer holder 10 exist in a vacuum state, and when it is switched OFF, the gas supplier 52 communicates with the wafer holder 10 to make the wafer holder 10 exist in an atmospheric pressure state.

Also, as shown in FIGS. 4 through 7, the wafer holder 10 comprises a plurality of tweezers 12, each of which can hold a wafer, and a tweezer block 14 for fixing the plurality of tweezers 12. The plurality of tweezers 12 are provided with a plurality of contacting portions 12a which are spaced from each other by a certain horizontal distance, with the contacting portions 12a defining a fork-shaped configuration (see FIG. 6).

In the present invention, it is preferable that each of the tweezers 12 be provided with at least three contacting portions 12a to uniformly hold the wafer. Also, it is more preferable that the horizontal distance between the contacting portions 12a be in a range from 10 mm to 200 mm.

Figure 7:
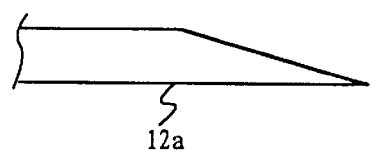
FIG. 7 is an enlarged view of portion A of FIG. 6.

In the present invention, it is further preferable that each of the contacting portions 12a be horizontally rounded at their respective free ends to prevent the wafer from being damaged when the two contact each other. In addition, it is also preferable that the free end of the contacting portion 12a be vertically sloped as shown in FIG. 7.

The contacting portions 12a may be integrally formed with the tweezer block 14, or may be provided separately from the tweezer block 14 and then coupled thereto.

The operational advantages of the large diameter wafer conveying system constructed as mentioned above are more fully described below.

Since the plurality of tweezers 12 of the wafer holder 10 have a plurality of contacting portions 12a forming the fork-shaped configuration, the holding force can be dispersed to more stably support the wafer, even when holding a large diameter wafer. In addition, since the free end of the contacting portion 12a is vertically sloped, even when the free end of the contacting portion 12a is struck by the wafer, the impact can be alleviated, whereby it is possible to prevent the wafer from being scratched, or generating contaminating particles, or being broken.

Also, in the large diameter wafer conveying system using vacuum absorption according to the present invention, when the valve unit 40, comprising the three-way solenoid valve, is switched OFF to unload the wafer from the tweezer 12, the residual vacuum clearer 50 is energized to clear the vacuum. On the other hand, when the valve unit 40 is switched ON, the wafer holder 10 is maintained in a vacuum state so as to convey the wafer, with the wafer being absorbed and held by the wafer holder 10.

When the valve unit 40 is turned OFF, the gas supplier 52 of the residual vacuum clearer 50 supplies a purified gas to the wafer holder 10 through the filtering member 54 so that the residual vacuum within the wafer holder 10 is cleared to maintain the wafer holder 10 in an atmospheric pressure state. Accordingly, when the wafer is unloaded from the tweezer 12, the wafer is prevented from remaining attached, such that it is possible to prevent the wafer from being damaged or from producing contaminating particles.

As described above, with the large diameter wafer conveying system of the present invention, it is possible to prevent a wafer from being scratched, from producing contaminating particles, or from being broken. The wafer can be stably held and then conveyed, and defects can be reduced to improve yield.

While the present invention has been described and illustrated with reference to a preferred embodiment thereof, it is to be readily understood that the present invention is not limited to the embodiment, and various changes and modifications can be made therein without departing from the spirit and scope of the invention defined in the appended claims.

What is claimed is:

1. A large diameter wafer conveying system comprising:

a vacuum supplier;

a valve unit for controlling a vacuum supplied from said vacuum supplier by switching said vacuum supplier ON or OFF; and a wafer holder for stably absorbing and holding a wafer by using said vacuum supplied from said vacuum supplier through said valve unit, said wafer holder comprising a plurality of tweezers forming a fork-shaped configuration for simultaneously holding a plurality of wafers, and a tweezer block for fixing said plurality of tweezers, each of said plurality of tweezers being provided with a plurality of contacting portions at respective free ends thereof, each of said plurality of contacting portions being spaced from each other by a certain horizontal distance, and said fork-shaped configuration of each of said plurality of tweezers including at least three arms extending from said tweezer block.

2. A large diameter wafer conveying system as claimed in claim 1, further comprising:

a residual vacuum clearer for automatically clearing a portion of said vacuum which remains after said valve unit is switched OFF to completely remove said vacuum.

3. A large diameter wafer conveying system as claimed in claim 2, said residual vacuum clearer comprising:

a gas supply for supplying a gas to said wafer holder to ensure said wafer holder exists in an atmospheric pressure state when said valve unit is switched OFF, and a filter for filtering said gas supplied from said gas supply.

4. A large diameter wafer conveying system as claimed in claim 3, wherein said gas supplied from said gas supply is one of atmospheric air or $N_2$.

5. A large diameter wafer conveying system as claimed in claim 2, wherein said valve unit is a three-way solenoid valve, whereby when said valve unit is switched ON, said vacuum supplier communicates with said wafer holder, and when said valve unit is switched OFF, said residual vacuum clearer communicates with said wafer holder.

6. A large diameter wafer conveying system as claimed in claim 1, wherein each of said plurality of tweezers is provided with at least three contacting portions so as to hold said wafer in balance.

7. A large diameter wafer conveying system as claimed in claim 1, wherein the horizontal distance between adjacent contacting portions is in a range from 10 mm to 200 mm.

8. A large diameter wafer conveying system as claimed in claim 1, wherein the free end of each of said plurality of contacting portions is vertically sloped, so as to prevent said wafer from being broken when each of said plurality of tweezers is struck by said wafer.

9. A method of conveying large diameter wafers, the method comprising:

supplying a vacuum to a wafer conveying apparatus via a vacuum supplier;

controlling the vacuum supplied from a vacuum supplier by switching said vacuum supplier ON or OFF; and absorbing and holding a wafer by using said vacuum supplied from said vacuum supplier when said vacuum supplier is switched ON, said holding including providing a wafer holder having a body with at least three mechanical support structures extending therefrom, each of the at least three mechanical support structures including contact portions at free ends thereof.

10. The method of claim 9, further comprising clearing a portion of said vacuum which remains after said vacuum supplier is switched OFF to completely remove said vacuum.

11. The method of claim 10, wherein said clearing includes:

supplying a gas to the wafer holder to ensure the wafer holder exists in an atmospheric pressure state when the vacuum supply is switched OFF, and filtering said gas supplied to the wafer holder.

12. The method of claim 11, wherein, during said absorbing and holding, said vacuum supplier is ON and communicates with said wafer holder, and during said clearing, said vacuum supplier is OFF and a residual vacuum clearer communicates with said wafer holder.

13. The method of claim 9, wherein said holding further comprises preventing breaking of the wafer when each of said plurality of tweezers is struck by the wafer by vertically sloping a free end of each of the plurality of contacting portions.

* * * * *